United States Patent
Khor et al.

(10) Patent No.: US 12,034,039 B2
(45) Date of Patent: Jul. 9, 2024

(54) THREE ELECTRODE CAPACITOR STRUCTURE USING SPACED CONDUCTIVE PILLARS

(71) Applicant: GlobalFoundries Singapore Pte. Ltd., Singapore (SG)

(72) Inventors: EeJan Khor, Singapore (SG); Ramasamy Chockalingam, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 60 days.

(21) Appl. No.: 17/451,172

(22) Filed: Oct. 18, 2021

(65) Prior Publication Data
US 2023/0123402 A1    Apr. 20, 2023

(51) Int. Cl.
*H01L 49/02* (2006.01)
(52) U.S. Cl.
CPC .................................. *H01L 28/92* (2013.01)
(58) Field of Classification Search
CPC ......... H01L 28/92; H01L 28/60; H01L 28/75; H01L 28/91
See application file for complete search history.

(56) References Cited

U.S. PATENT DOCUMENTS

| | | | |
|---|---|---|---|
| 6,043,526 A * | 3/2000 | Ochiai | H01L 28/75 257/295 |
| 6,717,193 B2 * | 4/2004 | Olewine | H01L 23/5223 257/295 |
| 7,736,527 B2 * | 6/2010 | Kim | H01L 21/3122 528/33 |
| 7,943,476 B2 | 5/2011 | Bang | |
| 9,368,392 B2 | 6/2016 | Tseng et al. | |
| 9,991,333 B1 * | 6/2018 | Liu | H01L 28/87 |
| 10,580,581 B2 | 3/2020 | Fox, III et al. | |
| 11,031,457 B2 | 6/2021 | Li et al. | |
| 2002/0058391 A1 | 5/2002 | Kim et al. | |
| 2003/0201476 A1 * | 10/2003 | Cheng | H01G 4/228 438/386 |
| 2003/0228733 A1 * | 12/2003 | Itoh | H01L 28/91 257/E21.019 |
| 2005/0275005 A1 | 12/2005 | Choi et al. | |

(Continued)

OTHER PUBLICATIONS

CN 111834332 (Year: 2020).*

*Primary Examiner* — Edward Chin
(74) *Attorney, Agent, or Firm* — Anthony Canale; Hoffman Warnick LLC (57) ABSTRACT

A capacitor structure for an integrated circuit (IC) and a related method of forming are disclosed. The capacitor structure includes three electrodes. A planar bottom electrode has a first insulator layer thereover. A middle electrode includes a conductive layer over the first insulator layer and a plurality of spaced conductive pillars contacting the conductive layer. A second insulator layer extends over and between the plurality of spaced conductive pillars and contacts the conductive layer. An upper electrode extends over the second insulator layer, and hence, over and between the plurality of spaced conductive pillars. A length of the upper electrode can be controlled, in part, by the number and dimensions of the conductive pillars to increase capacitance capabilities per area.

20 Claims, 12 Drawing Sheets

(56) References Cited

U.S. PATENT DOCUMENTS

| | | | |
|---|---|---|---|
| 2006/0270177 A1* | 11/2006 | Park | H01L 28/91 438/386 |
| 2007/0026625 A1* | 2/2007 | Chung | H01L 21/3162 438/785 |
| 2008/0142474 A1* | 6/2008 | Kim | H01G 13/00 216/6 |
| 2009/0134491 A1* | 5/2009 | Plum | H10B 12/09 257/532 |
| 2010/0230806 A1* | 9/2010 | Huang | H01L 21/565 257/723 |
| 2012/0080772 A1* | 4/2012 | Asami | H01L 23/642 257/532 |
| 2012/0304742 A1 | 12/2012 | Cummins | |
| 2013/0181326 A1 | 7/2013 | Cheng et al. | |
| 2014/0225222 A1 | 8/2014 | Yu et al. | |
| 2015/0295020 A1* | 10/2015 | Tseng | H01L 27/0805 257/532 |
| 2016/0000344 A1 | 1/2016 | Cao | |
| 2016/0118458 A1* | 4/2016 | Zang | H01L 23/5223 257/534 |
| 2016/0322456 A1* | 11/2016 | Wang | H01L 28/90 |
| 2016/0336311 A1* | 11/2016 | Kim | H01L 28/91 |
| 2017/0104057 A1* | 4/2017 | Voiron | H01L 27/0805 |
| 2017/0170256 A1* | 6/2017 | Zhou | H01L 28/91 |
| 2018/0342519 A1* | 11/2018 | Kim | H10B 12/0335 |
| 2019/0051659 A1 | 2/2019 | Xie et al. | |
| 2019/0198605 A1* | 6/2019 | Reznicek | H01L 27/0629 |
| 2019/0348496 A1* | 11/2019 | Murase | H01L 27/0805 |
| 2020/0066443 A1* | 2/2020 | Lu | H01L 21/7688 |
| 2020/0091279 A1* | 3/2020 | Moon | H01L 21/02304 |
| 2020/0219656 A1* | 7/2020 | Higuchi | H01G 4/012 |
| 2021/0175323 A1 | 6/2021 | Singh et al. | |
| 2021/0202507 A1* | 7/2021 | Thareja | H10B 53/00 |
| 2021/0257371 A1* | 8/2021 | Son | H10B 12/34 |
| 2021/0280670 A1* | 9/2021 | El Sabahy | H01G 4/012 |
| 2021/0399135 A1* | 12/2021 | Polakowski | H10B 53/30 |
| 2022/0238281 A1* | 7/2022 | Nagata | H01G 4/012 |
| 2023/0046455 A1* | 2/2023 | Wong | H01L 28/24 |

* cited by examiner

THREE ELECTRODE CAPACITOR STRUCTURE USING SPACED CONDUCTIVE PILLARS

BACKGROUND

The present disclosure relates to integrated circuit (IC) fabrication, and more specifically, to a capacitor structure with three electrodes in a metal-insulator-metal-insulator-metal (MIMIM) arrangement that, in part, undulates over conductive pillars to create a higher density capacitor. A related method is also provided.

Capacitors are used widely in integrated circuits, such as accelerated processing units (APU) or graphics processing units (GPU), to store a charge. Capacitors can take a variety of forms such as vertical natural capacitors (VNCAP) and metal-oxide-metal (MOM) capacitors. Current capacitors are also formed from a combination of metal-insulator-metal (MIM) layers. MIM layers are typically arranged in a planar fashion in the IC, and electrical contacts are made to each of the metal layers to form the capacitor. Planar MIM capacitors use a relatively large area due to their planar layout. Consequently, the density of planar MIM capacitors and the capacitance per unit semiconductor area for planar MIM capacitors are not competitive. One approach to improve capacitance uses undulating MIM layers with contacts to ends of the layer, but this provides poor contact resistance. Finger-based MIM capacitors employ complex finger elements but are more difficult to manufacture.

SUMMARY

An aspect of the disclosure is directed to a capacitor structure for an integrated circuit (IC), the capacitor structure comprising: a planar bottom electrode; a first insulator layer over the planar bottom electrode; a middle electrode including a conductive layer over the first insulator layer and a plurality of spaced conductive pillars contacting the conductive layer; a second insulator layer over and between the plurality of spaced conductive pillars and contacting the conductive layer; and an upper electrode over the second insulator layer.

Another aspect of the disclosure includes a capacitor structure for an integrated circuit (IC), the capacitor structure comprising: a planar bottom electrode including copper; a first insulator layer over the planar bottom electrode; a middle electrode including a conductive layer over the first insulator layer and a plurality of spaced aluminum pillars contacting the conductive layer; a second insulator layer over and between the plurality of spaced aluminum pillars and contacting the conductive layer; and an upper electrode over the second insulator layer.

An aspect of the disclosure related to a method of forming a three-electrode capacitor structure for an integrated circuit, the method comprising: forming a planar bottom electrode in a dielectric layer; forming a first insulator layer over the planar bottom electrode; forming a middle electrode by forming a conductive layer over the first insulator layer and forming a plurality of spaced aluminum pillars in contact with the conductive layer; forming a second insulator layer over and between the plurality of spaced aluminum pillars and over the conductive layer; and forming an upper electrode over the second insulator layer, the upper electrode extending over and between the plurality of spaced aluminum pillars, wherein the second insulator layer and the upper electrode undulate over the plurality of spaced aluminum pillars.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a capacitor structure for an integrated circuit (IC). The capacitor structure includes three electrodes. A planar bottom electrode has a first insulator layer thereover. A middle electrode includes a conductive layer over the first insulator layer and a plurality of spaced conductive pillars contacting the conductive layer. A second insulator layer extends over and between the plurality of spaced conductive pillars and contacts the conductive layer. An upper electrode extends over the second insulator layer, and hence, over and between the plurality of spaced conductive pillars. A related method of forming a capacitor structure is also provided.

Referring to FIGS. 1-8, embodiments of a method of forming a capacitor structure 100 (FIGS. 7-8), namely a three electrode, stacked MIMIM capacitor, for an integrated circuit (IC) 102 (FIGS. 7-8), are illustrated.

Figure 1:
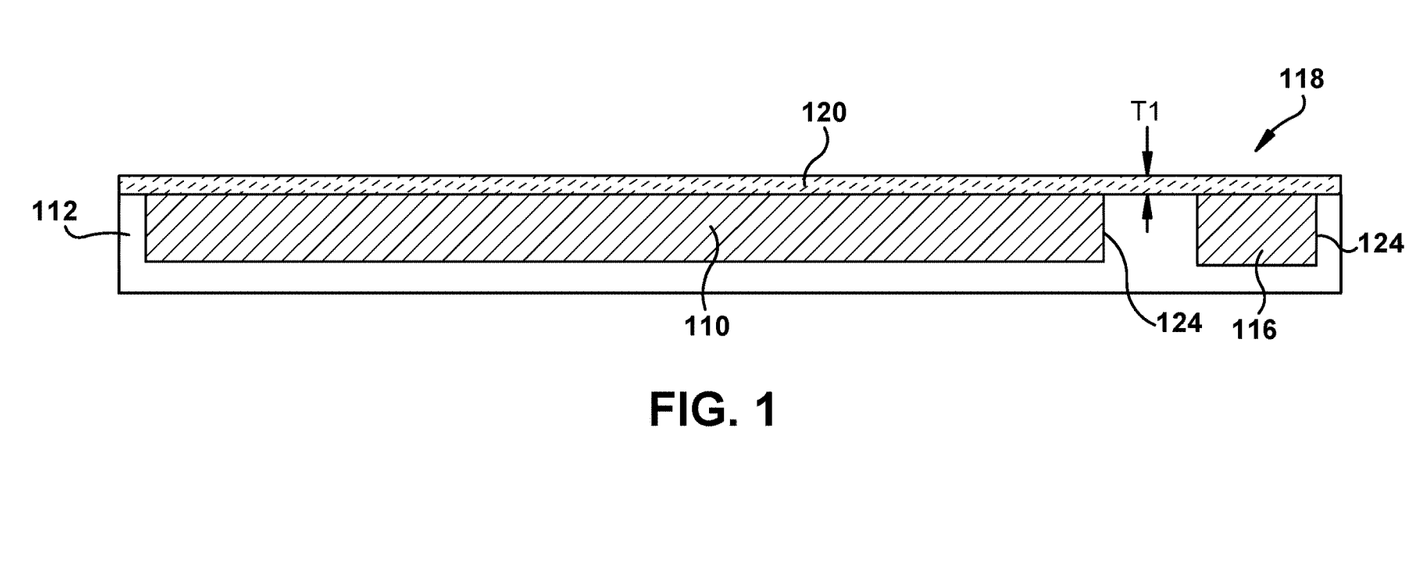
FIG. 1 shows a cross-sectional view of a preliminary structure for a method of forming a capacitor structure including the forming of a planar bottom electrode, according to embodiments of the disclosure.

FIG. 1 shows a cross-sectional view of forming a planar bottom electrode 110 in a dielectric layer 112. Planar bottom electrode 110 (hereinafter "bottom electrode 110") may include any metal layer in IC 102. In one example, bottom electrode 110 may be in a first metal layer, i.e., over a device layer (not shown). However, bottom electrode 110 may be in any back end of line (BEOL) or middle-of-line (MOL) layer. As understood, a BEOL or MOL layer is any layer formed on the semiconductor wafer (not shown) during device manufacturing following first metallization. Dielectric layer 112 may include any dielectric commonly used as an interlayer dielectric (ILD). Dielectric layer 112 may include but is not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric.

Bottom electrode 110 may be formed in any now known or later developed fashion. In one non-limiting example, bottom electrode 110 may be formed by lithographically defining openings 124 in dielectric layer 112, then depositing a metal to fill the resulting openings, and then removing excess metal, e.g., by means of chemical-mechanical polishing (planarization). Openings 124 may be etched in dielectric layer 112, i.e., using a mask (not shown). Etching generally refers to the removal of material from a substrate (or structures formed on the substrate) and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Openings 124 for bottom electrode 110 may be etched, for example, using RIE.

Figure 7:
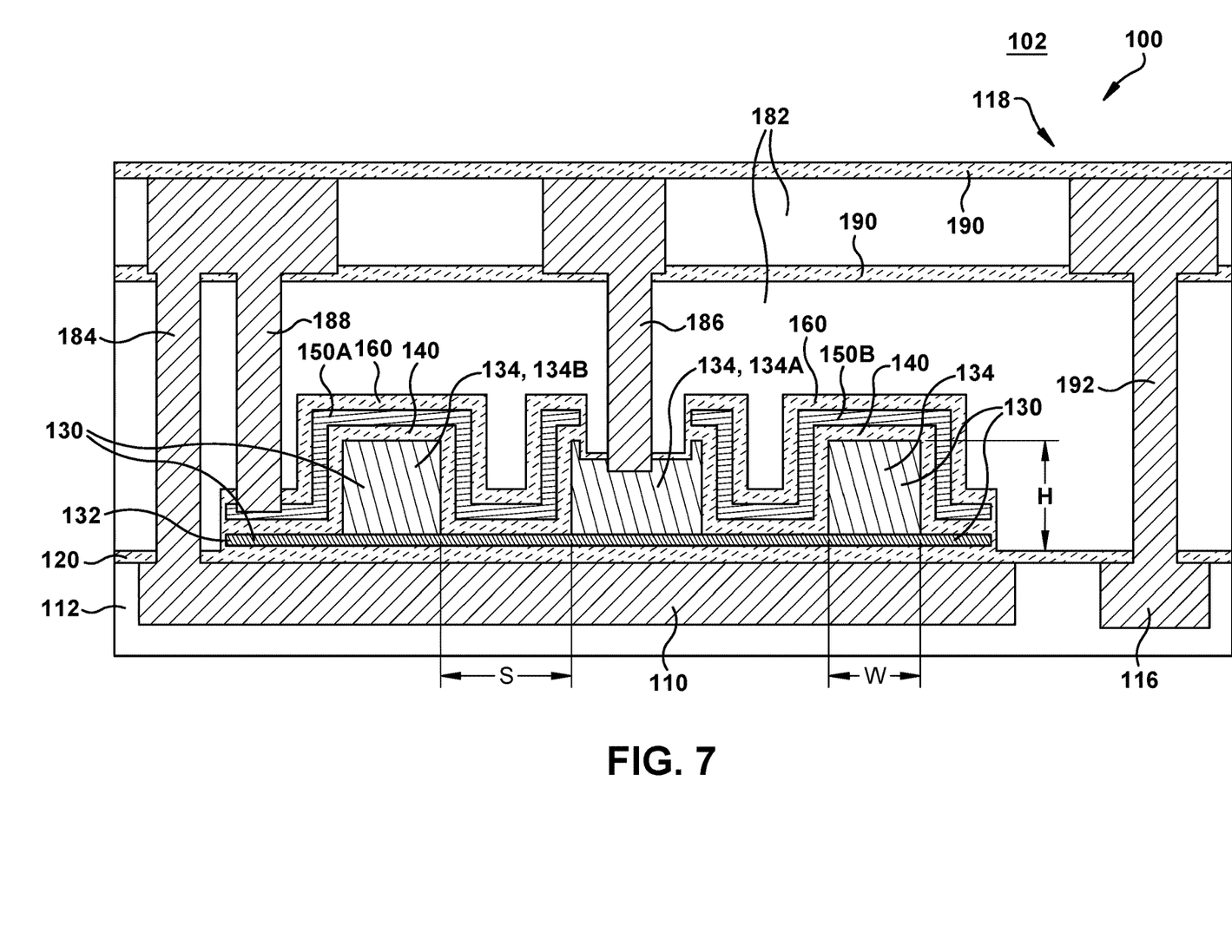
FIG. 7 shows a cross-sectional view of a capacitor structure including contacts thereto, according to embodiments of the disclosure.
Figure 8:
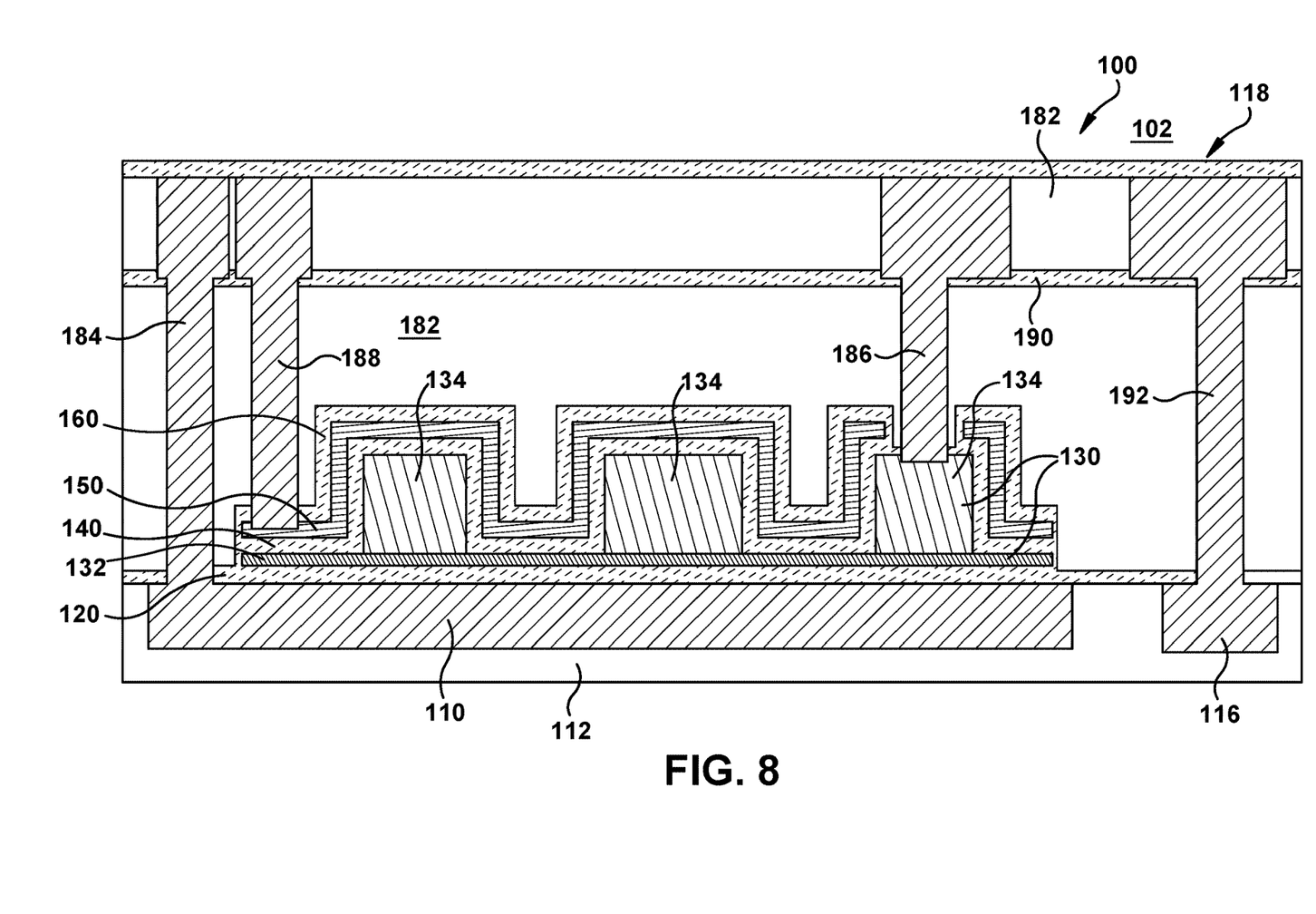
FIG. 8 shows a cross-sectional view of a capacitor structure, according to other embodiments of the disclosure.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, the metal may be deposited using, for example, ALD. A refractory metal liner (not shown) of, for example, ruthenium (Ru), tantalum (Ta), titanium (Ti), tungsten (W), iridium (Ir), rhodium (Rh), platinum (Pt), etc., or mixtures of thereof, may be deposited prior to metal deposition. Bottom electrode 110 may include any conductor employed in IC wiring, for example, copper, and may be deposited, for example, using ALD. Metal wire(s) 116 may also be formed with bottom electrode 110 for a non-capacitor region 118 (FIGS. 7-8), e.g., for logic or other interconnect structures, adjacent to capacitor structure 100 (FIGS. 7-8).

FIG. 1 also shows forming a first insulator layer 120 over planar bottom electrode 110. First insulator layer 120 may include any insulator used for capacitors. In certain embodiments, first insulator layer 120 includes silicon nitride (SiN). However, first insulator layer 120 may include any high-k dielectric such as but not limited to: tantalum oxide ($Ta_2O_5$), barium titanium oxide ($BaTiO_3$), hafnium oxide ($HfO_2$), zirconium oxide ($ZrO_2$), aluminum oxide ($Al_2O_3$), hafnium silicate oxide (HfSixOy) or hafnium silicon oxynitride (HfSixOyNz), where x, y, and z represent relative proportions, each greater than or equal to zero. First insulator layer 120 may be deposited, for example, using ALD. A thickness T1 of first insulator layer 120 can be controlled to select a capacitive capability thereof.

Figure 2:
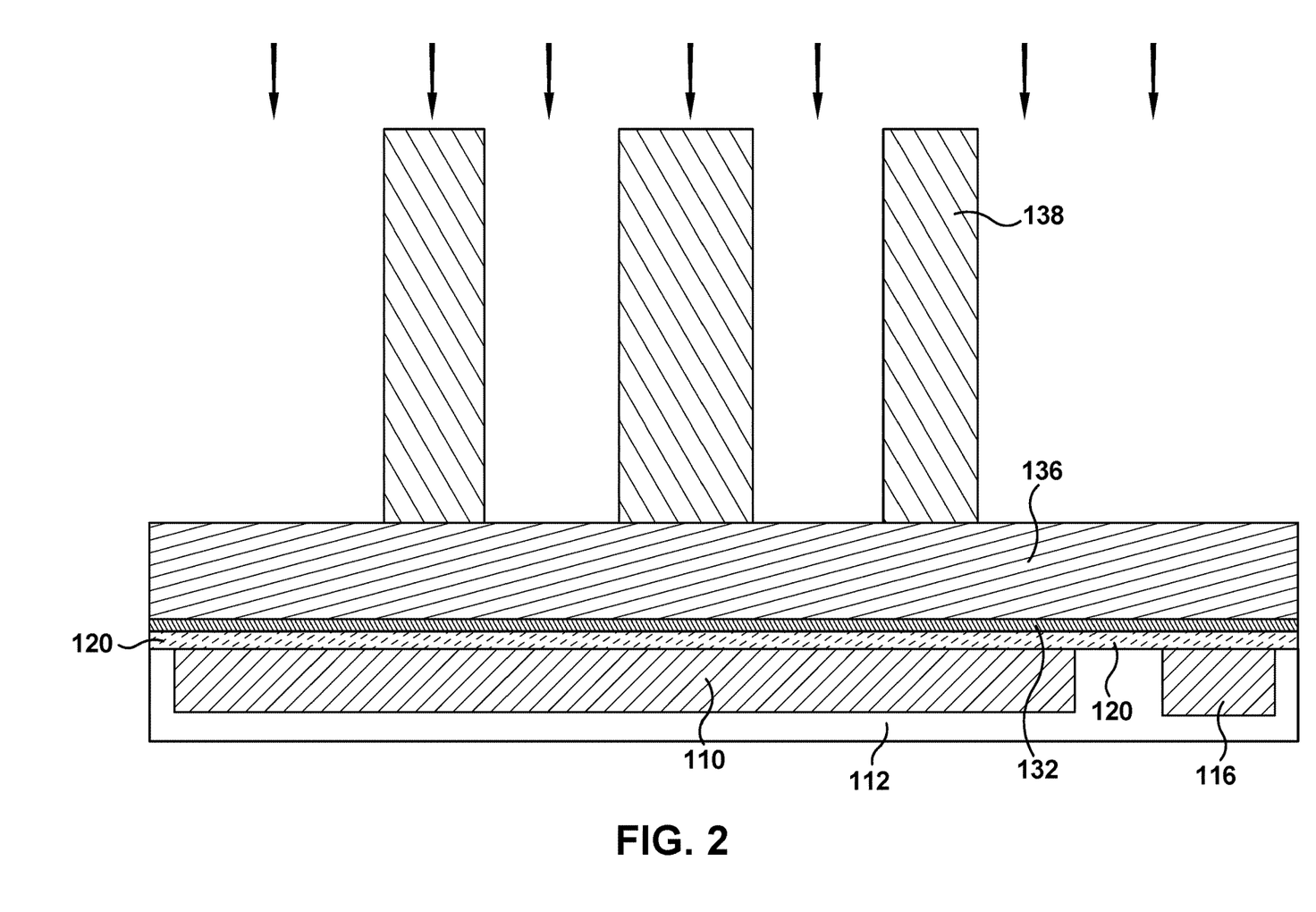
FIG. 2 shows a cross-sectional view of forming a capacitor metal and an insulator layer for a middle electrode.
Figure 3:
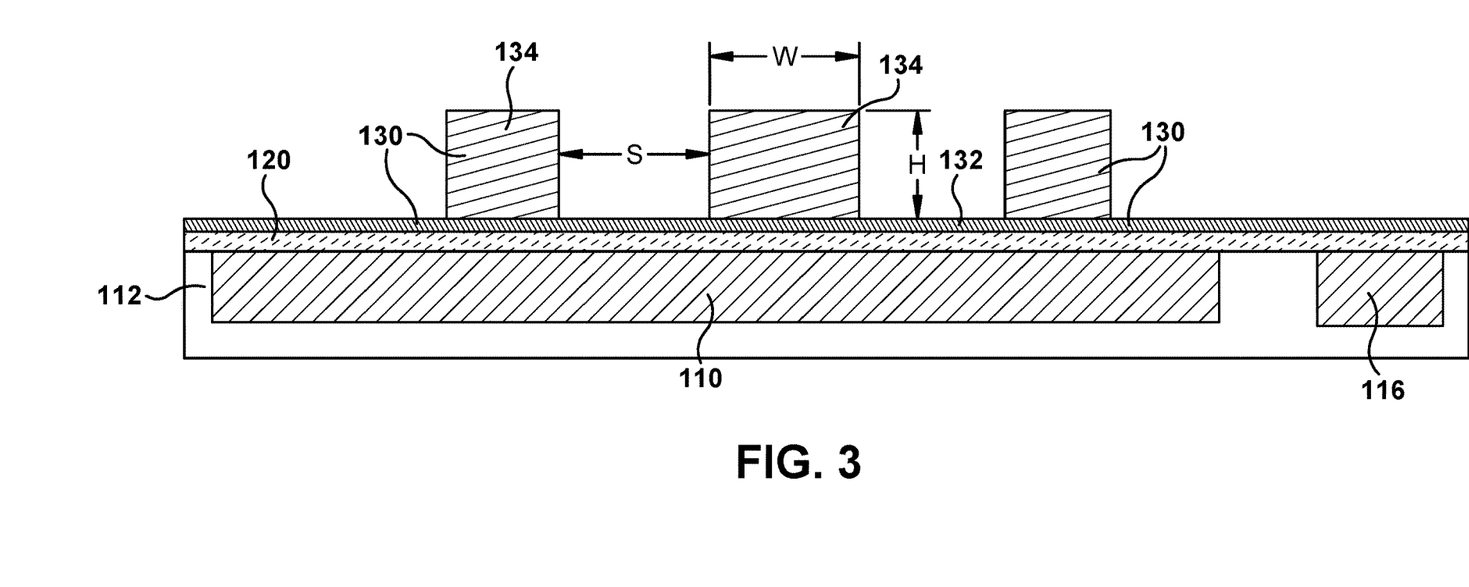
FIG. 3 shows a cross-sectional view of the capacitor metal and insulator layer after patterning the capacitor metal into conductive pillars to form the middle electrode.

FIGS. 2-3 show cross-sectional views of forming a middle electrode 130 (FIG. 3) by forming a conductive layer 132 over first insulator layer 120 and forming a plurality of spaced conductive pillars 134 (FIG. 3) in contact with conductive layer 132. Conductive layer 132 is formed over bottom electrode 110, and may be formed, for example, by ALD. Conductive layer 132 may include any now known or later developed capacitor metal such as but not limited to: titanium nitride (TiN), ruthenium (Ru), and tantalum nitride (TaN). In one example, conductive layer 132 includes TiN. Conductive pillars 134 (FIG. 3) may be formed by forming another conductive layer 136 (FIG. 2) over conductive layer 132 and patterning conductive layer 136 to form the plurality of spaced conductive pillars 134 (FIG. 3). Conductive layer 136 may be formed, for example, by ALD. Conductive layer 136 may be patterned using any now known or later developed patterning technique. In one example, as shown in FIG. 2, a patterned mask 138 is formed over conductive layer 136 and an etch is performed, e.g., a RIE, to remove portions of conductive layer 136 not covered by mask 138. The etch does not remove conductive layer 132. Mask 138 may include any now known or later developed masking material appropriate for conductive layer 136. Conductive layer 136 may include any back-end-of-line conductive metal or metal alloy. In one example, conductive layer 136 includes aluminum (Al), therefore, it includes an aluminum layer. Hence, spaced conductive pillars 134 may be spaced aluminum pillars, and conductive layer 136 may be aluminum.

Figure 4:
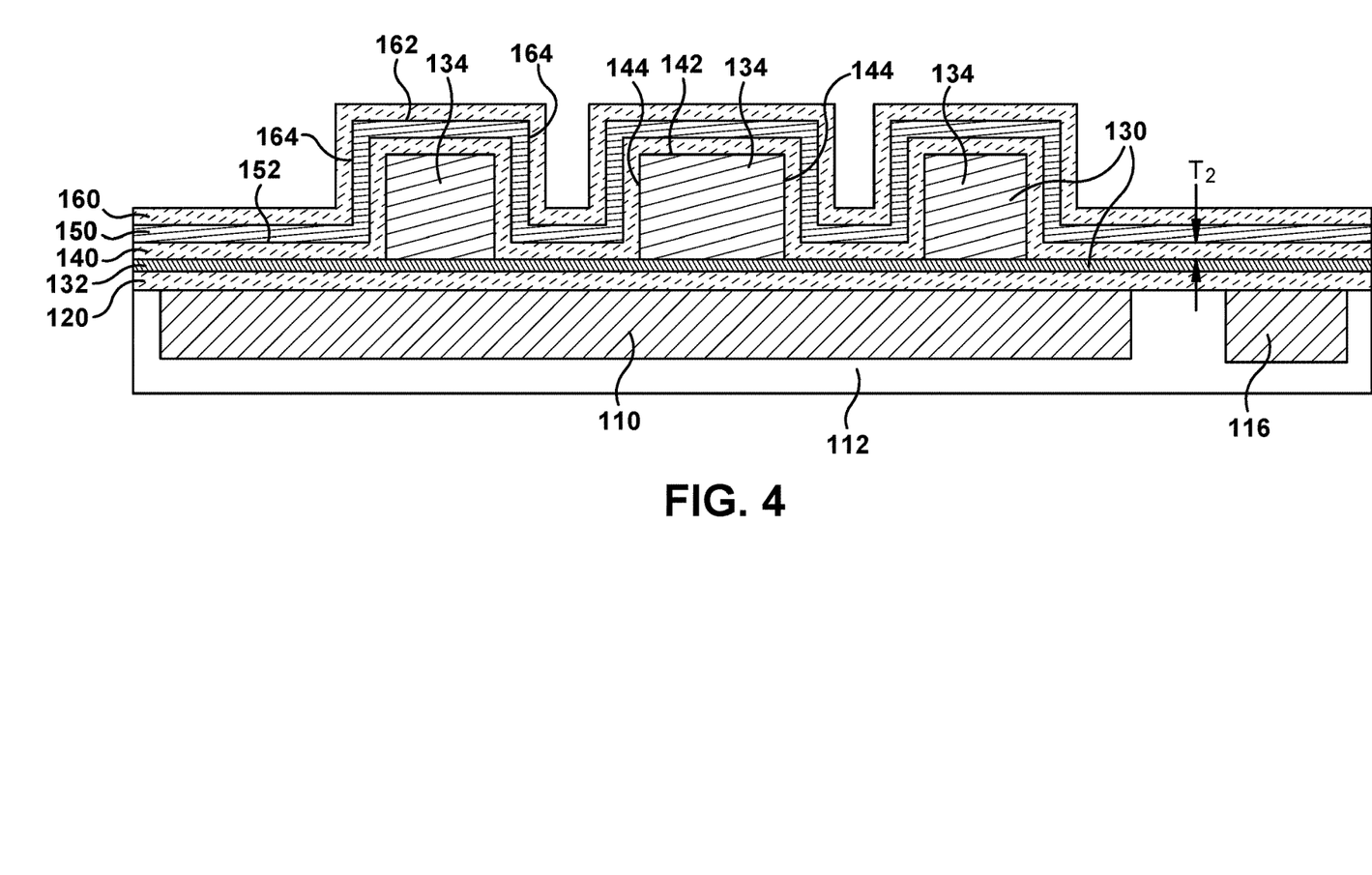
FIG. 4 shows a cross-sectional view of forming another insulator layer and forming a capacitor metal over the middle electrode to form an upper electrode.

The number of spaced conductive pillars 134, certain dimensions of each conductive pillar 134 (e.g., height H and width W), and a spacing(s) S between adjacent conductive pillars 134 can all be user selected to control the length of certain parts of capacitor structure 100, and hence, the capacitive capabilities of those parts. Notably, as will be described, the noted parameters can be controlled to size an upper part of capacitor structure 100 including an upper electrode 150 (FIG. 4) and a second insulator layer 140 (FIG. 4). The dimensions of each conductive pillar 134 and spacing(s) therebetween can be uniform or non-uniform. In the example shown, three conductive pillars 134 are created, but any number can be formed. Once conductive pillars 134 have been formed, mask 138 can be removed using any known process, e.g., an ashing. Collectively, conductive layer 132 and plurality of spaced conductive pillars 134 constitute middle electrode 130.

FIG. 4 shows a cross-sectional view of forming a second insulator layer 140 over and between plurality of spaced conductive pillars 134 and over conductive layer 132. Second insulator layer 140 may include the same or different material than first insulator layer 120 and may include any insulator used for capacitors. In certain embodiments, second insulator layer 140 includes silicon nitride (SiN). However, second insulator layer 140 may include any other insulator material listed herein for first insulator layer 120. Second insulator layer 140 may be deposited, for example, using ALD. As shown, second insulator layer 140 is over and between plurality of spaced conductive pillars 134 and contacts conductive layer 132. Second insulator layer 140 contacts an upper surface 142 and sidewalls 144 of each conductive pillar 134 but continues to leave a space between adjacent conductive pillars 134. Hence, second insulator layer 140 undulates over plurality of spaced conductive pillars 134. Second insulator layer 140 covers middle electrode 130, isolating middle electrode 130 from planar bottom electrode 110 and a later formed upper electrode 150 (FIGS. 7-8) to be built over it. A thickness T2 of second insulator layer 140 can be controlled to select a capacitive capability thereof and control a length of later formed upper electrode 150.

FIG. 4 also shows forming an upper electrode 150 over second insulator layer 140. Like second insulator layer 140, upper electrode 150 extends over and between plurality of spaced conductive pillars 134. Upper electrode 150 contacts an upper surface 152 of second insulator layer 140 but continues to leave a space between adjacent conductive pillars 134. Second insulator layer 140 and upper electrode 150 undulate over plurality of spaced conductive pillars 134. Hence, a length of upper electrode 150 can be controlled by the number of spaced conductive pillars 134, the dimensions of each conductive pillar 134 (e.g., height H and width W (FIG. 3)), and a spacing(s) S (FIG. 3) between adjacent conductive pillars 134. A length of upper electrode 150 can also be controlled by thickness T2 of second insulator layer 140. All of these parameters can be controlled to select a capacitive capability of at least part of capacitor structure 100, i.e., the upper MIM part thereof.

FIG. 4 also shows forming a third insulator layer 160 over upper electrode 150. Third insulator layer 160 may extend over and between plurality of spaced conductive pillars 134. Third insulator layer 160 may include the same or different material than first and second insulator layers 120, 140, and may include any insulator used for capacitors or an etch stop layer. In certain embodiments, third insulator layer 160 includes silicon nitride (SiN). However, third insulator layer 160 may include any other insulator material listed herein for first and second insulator layer 120, 140. Third insulator layer 160 may be deposited, for example, using ALD. As shown, third insulator layer 160 is over and between plurality of spaced conductive pillars 134 and contacts upper electrode 150. Third insulator layer 160 contacts an upper surface 162 and sidewalls 164 of upper electrode 150 as it extends over conductive pillar 134 but continues to leave a space between adjacent conductive pillars 134. Hence, third insulator layer 160 also undulates over plurality of spaced conductive pillars 134. Third insulator layer 160 covers upper electrode 150, isolating upper electrode 150 from interconnects to be formed in an interlayer dielectric (ILD) 182 (FIGS. 7-8) thereover.

Figure 5:
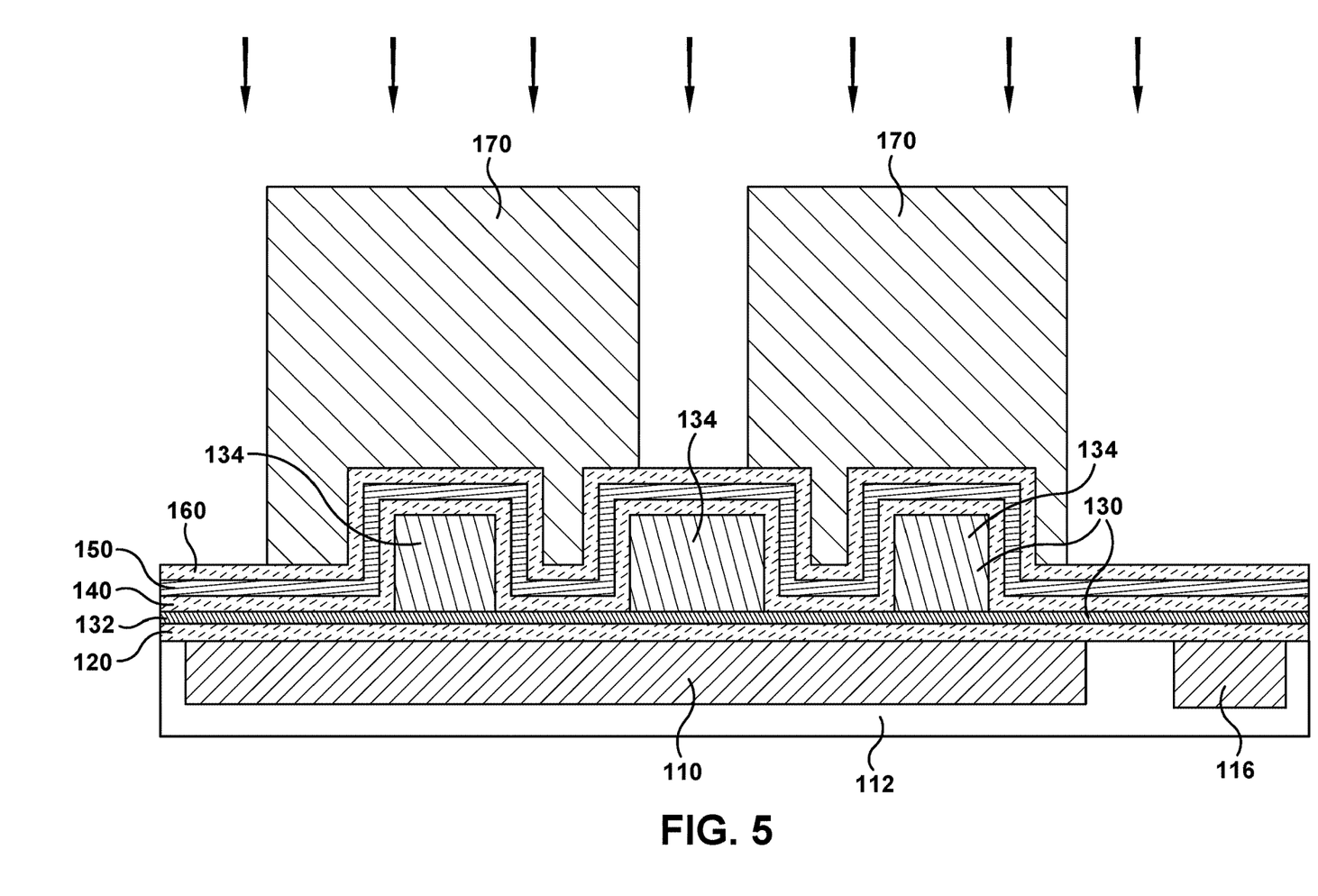
FIG. 5 shows a cross-sectional view of part of the dimensioning the middle and upper electrode.
Figure 6:
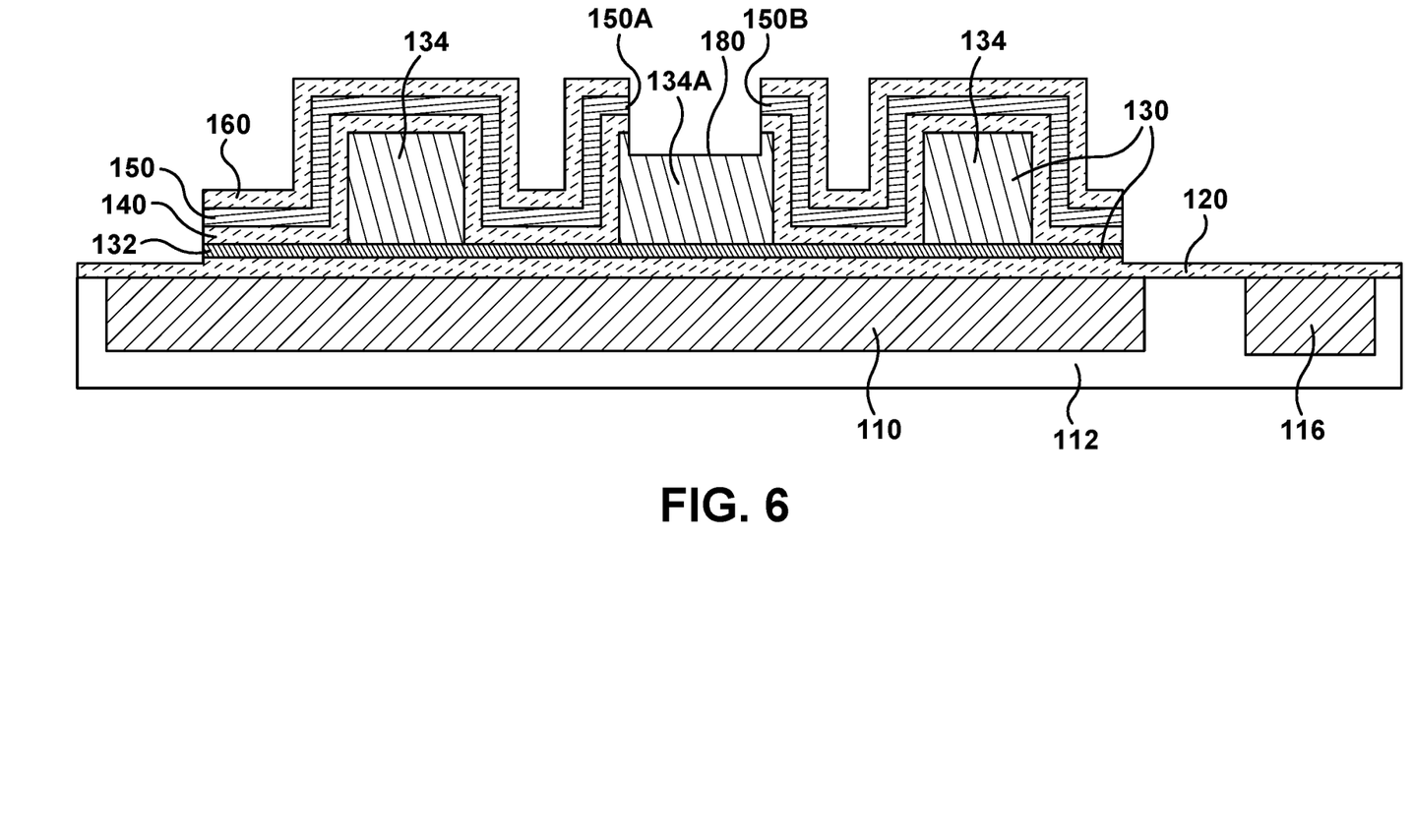
FIG. 6 shows a cross-sectional view after dimensioning the middle and upper electrode.

FIGS. 5-6 show cross-sectional views of patterning upper electrode 150, second insulator layer 140 and middle electrode 130 to selected dimensions, e.g., length, thus selecting a capacitive capability of these parts for capacitor structure 100 (FIGS. 7-8). Third insulator layer 160 may also be patterned during this process. Electrodes 130, 150 and insulator layer(s) 140, 160 may be patterned using any now known or later developed patterning technique. In one example, as shown in FIG. 5, a patterned mask 170 is formed over upper electrode 150, second insulator layer 140 and middle electrode 130, and an etch is performed, e.g., a RIE, to remove portions of upper electrode 150, second insulator layer 140 and middle electrode 130 (and third insulator layer 160) not covered by mask 138. Mask 138 may include any now known or later developed masking material appropriate for the layers to be etched. The dimensions of upper electrode 150, second insulator layer 140 and middle electrode 130 (and third insulator layer 160) may be user defined. While shown as length only in FIGS. 5-6, it should be recognized that upper electrode 150, second insulator layer 140 and middle electrode 130 (and third insulator layer 160) may also be dimensioned into and out of the page. The dimensions of upper electrode 150, second insulator layer 140 and middle electrode 130 (and third insulator layer 160) can all be user selected to control the capacitive capabilities of those parts. In the non-limiting example shown, upper electrode 150, second insulator layer 140 and third insulator layer 160 are removed from over an upper surface 180 of one of conductive pillars 134A, creating two upper electrodes 150A, 150B. The process can occur for any number of conductive pillars 134. The undulation of upper electrode(s) 150 over conductive pillars 134 allows for more length within a smaller area and thus a higher capacitive capability for upper electrode(s) 150. While shown as a single patterning process, other embodiments may use more than one patterning process, e.g., one for upper electrode 150 (and third insulator layer 160) and another for second insulator layer 140 and middle electrode 130. Once upper electrode 150, second insulator layer 140 and middle electrode 130 (and third insulator layer 160) have been dimensioned, mask 170 (FIG. 5) can be removed using any known process, e.g., an ashing.

FIG. 7 shows forming ILD 182 over the structure, and forming, through ILD 182, a first contact 184 operatively coupled to planar bottom electrode 110, a second contact 186 operatively coupled to one of plurality of spaced conductive pillars 134A of middle electrode 130, and a third contact 188 operatively coupled to (one of) upper electrode(s) 150A. ILD 182 may include an interlayer dielectric listed herein, and may include one or more layers, perhaps separated by various etch stop layers (ESLs) 190. Contacts 184, 186, 188 may be coupled together in upper portions of ILD 182 in any fashion, e.g., with metal wires. FIG. 7 also shows forming contact(s) 192 to metal wire(s) 116 for non-capacitor region 118 (FIG. 7), e.g., for logic or other interconnect structures, adjacent to capacitor structure 100. Contacts 184, 186, 188, 192 may be formed using any now known or later developed technique. For example, openings for each contact can be formed, a liner deposited, a metal deposited, and a planarization performed to remove any excess metal.

As shown in FIG. 7, capacitor structure 100 for IC 102 includes a three electrode capacitor in the form of a metal-insulator-metal-insulator-metal (MIMIM) layered arrangement. More particularly, capacitor structure 100 may include planar bottom electrode 110 and first insulator layer 120 over planar bottom electrode 110. Capacitor structure 100 also includes middle electrode 130 including conductive layer 132 over first insulator layer 120 and plurality of spaced conductive pillars 134 contacting conductive layer 132. That is, collectively, conductive layer 132 and plurality of spaced conductive pillars 134 constitute middle electrode 130. Second insulator layer 140 is over and between plurality of spaced conductive pillars 134 and contacts conductive layer 132. The capacitive capabilities of second insulator layer 140 can be controlled by the number of conductive pillars 134 it extends over, and by its thickness. Upper electrode 150 is over second insulator layer 140. Capacitor structure 100 can be in any back-end-of-line or middle-of-line interconnect layer in IC 102.

Planar bottom electrode 110 may include a first capacitor metal, e.g., copper or other interconnect metal. Upper electrode 150 and conductive layer 132 of middle electrode 130 may include a different, second capacitor metal, e.g., titanium nitride (TiN), ruthenium (Ru), and tantalum nitride (TaN). Plurality of spaced conductive pillars 134 include a different, third capacitor metal, e.g., aluminum or other interconnect metal. First insulator layer 120 and second insulator layer 140 each may include a capacitor insulator material as listed herein, such as silicon nitride (SiN).

Capacitor structure 100 may also include first contact 184 operatively coupled to planar bottom electrode 110, second contact 186 operatively coupled to middle electrode 130, and third contact 188 operatively coupled to upper electrode 150A. Additional contacts (not shown) can also be provided, e.g., to upper electrode 150B. Second contact 186 may be operatively coupled to one of the plurality of spaced conductive pillars 134A of middle electrode 130.

Second insulator layer 140 and upper electrode 150 undulate over the plurality of spaced conductive pillars 134. At least one of plurality of spaced conductive pillars 134 (134B in FIG. 7 as shown) is contacted on three sides by second insulator layer 140. Any number of capacitive pillars 134 may be used to lengthen upper electrode 150 and second insulator layer 140. In the non-limiting example shown at least two conductive pillars 134 (e.g., two aluminum pillars) are used.

The number of spaced conductive pillars 134 and the dimensions of each conductive pillar 134 (e.g., height H and width W), and spacing(s) S between adjacent conductive pillars 134 can all be user selected to control the length of certain parts of capacitor structure 100, e.g., second insulator layer 140, and hence, the capacitive capabilities of those parts. For example, the number and size of conductive pillars and spacing therebetween controls the length of upper electrode 150 and second insulator layer 140 (and third insulator layer 160). Hence, the noted parameters can be controlled to size upper electrode 150 and second insulator layer 140, along with the afore-described patterning of middle electrode 130, second insulator layer 140 and upper electrode 150. A length of upper electrode 150 and second insulator layer 140 can hence be controlled, in part, by the number and dimensions of the conductive pillars to increase capacitance capabilities per area. The dimensions of each conductive pillar 134 and spacing(s) therebetween can be uniform or non-uniform.

Figure 9:
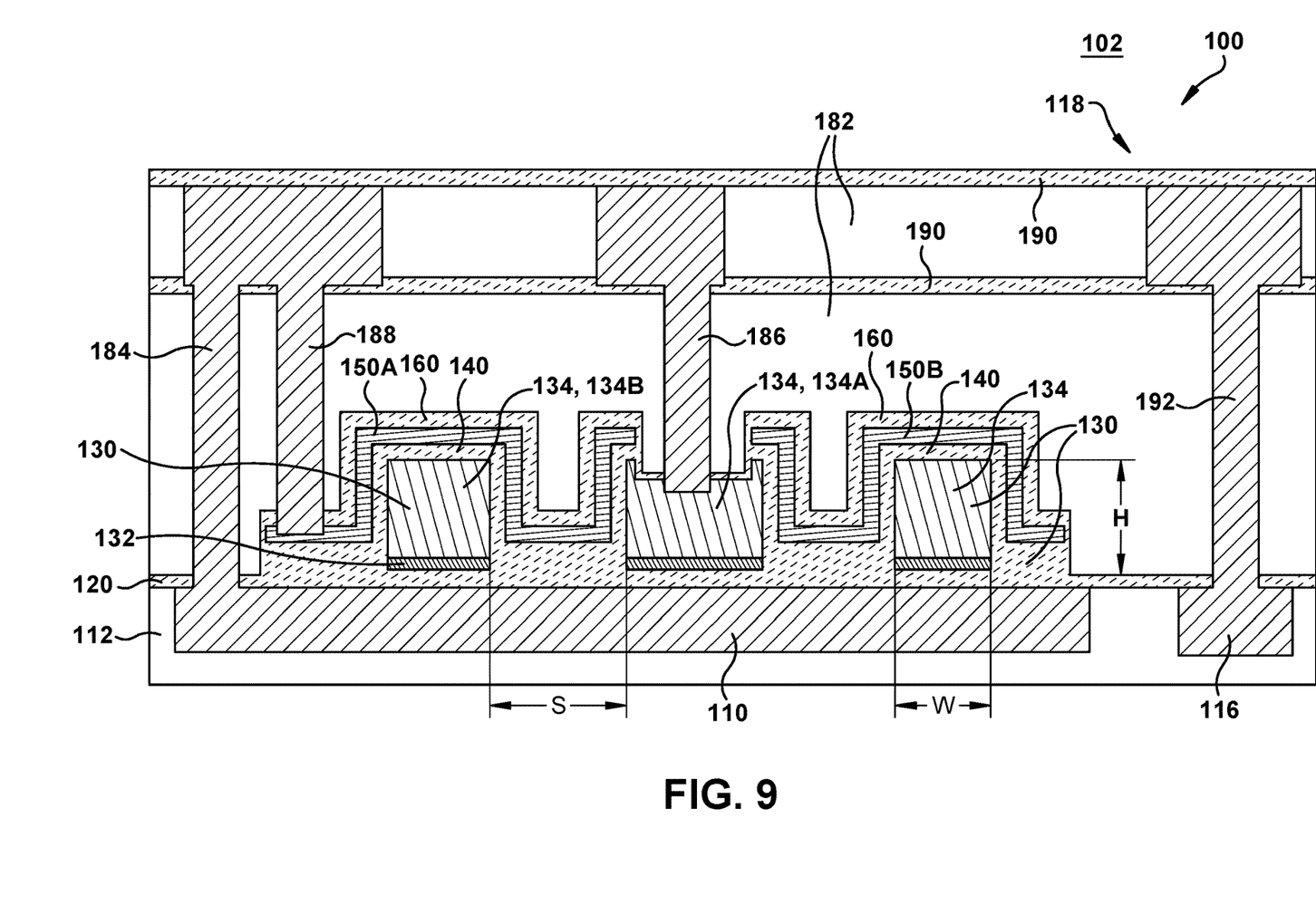
FIG. 9 shows a cross-sectional view of a capacitor structure including contacts thereto, according to an alternative embodiment of the disclosure.
Figure 10:
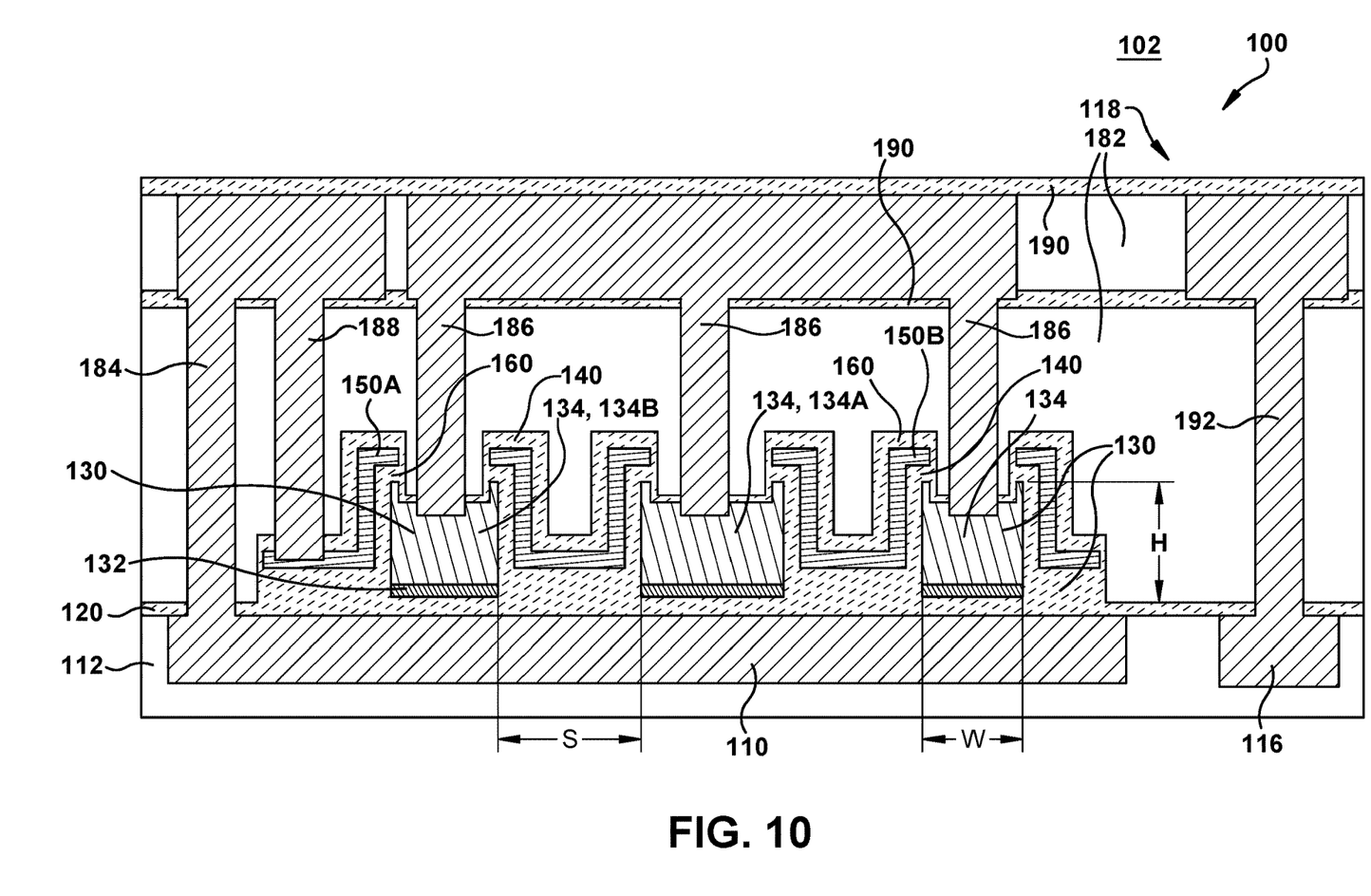
FIG. 10 shows a cross-sectional view of a capacitor structure including contacts thereto, according to another alternative embodiment of the disclosure.

FIGS. 8-10 show alternative embodiments of capacitor structure 100. In the example shown in FIG. 7, two conductive pillars 134 are used, but any number can be used to control the length of upper electrode 150. For example, FIG. 8 shows another embodiment of capacitor structure 100 in which three conductive pillars 134 are used to increase the length of second insulator layer 140, middle electrode 130, and upper electrode 150. FIGS. 9 and 10 show cross-sectional views of an embodiment, similar to FIG. 7, except conductive layer 132 is discontinuous and located only under conductive pillars 134. Conductive layer 132 may be made discontinuous by extending the etching shown in FIG. 2 to remove conductive layer 132 while patterning conductive pillars 132. The steps thereafter are substantially similar or identical to those explained herein. FIG. 10 also includes a second contact 186 to each conductive pillar 134, segmenting upper electrode 150 into more parts.

Figure 11:
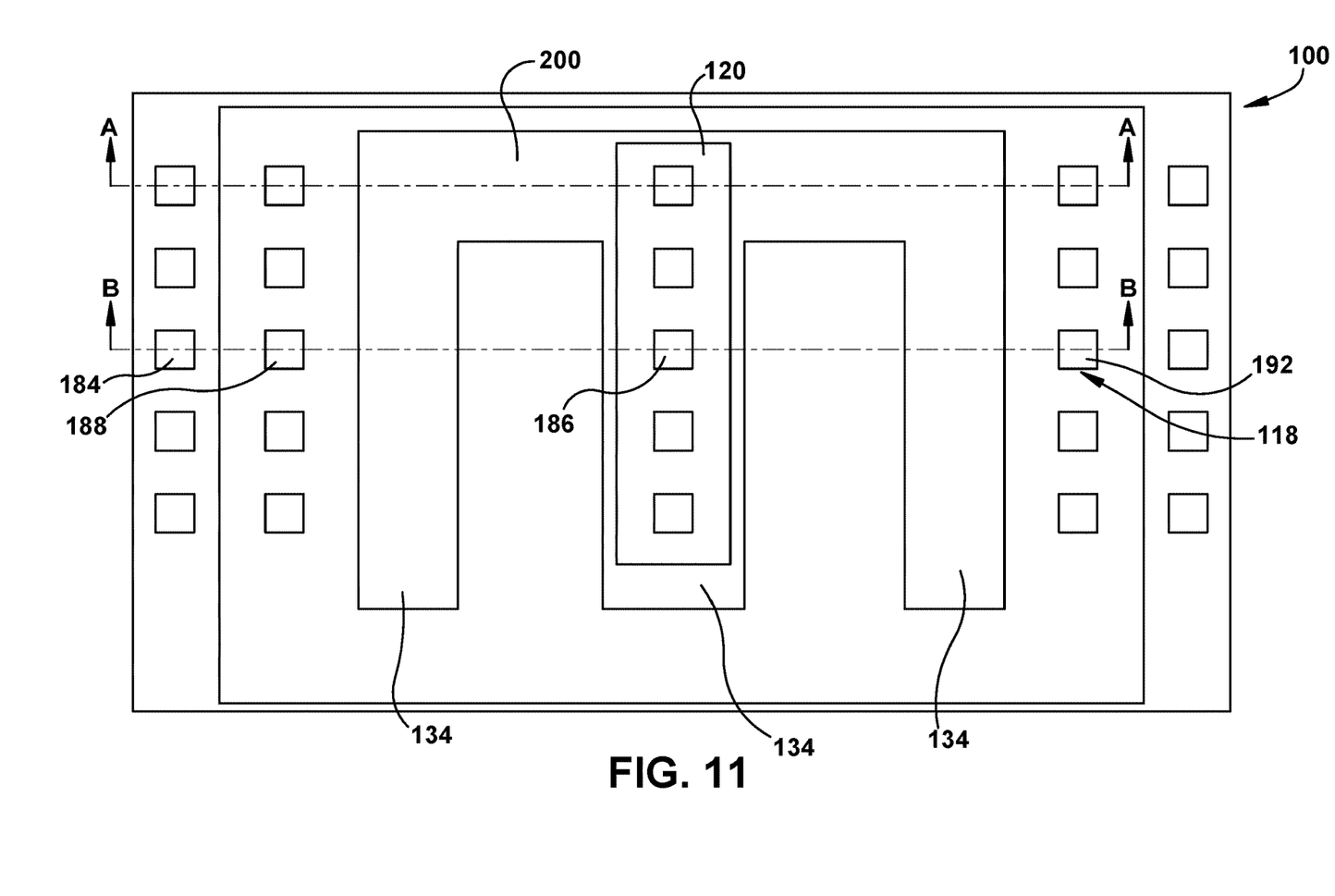
FIG. 11 shows a plan view of a capacitor structure, according to an alternative embodiment of the disclosure.
Figure 12:
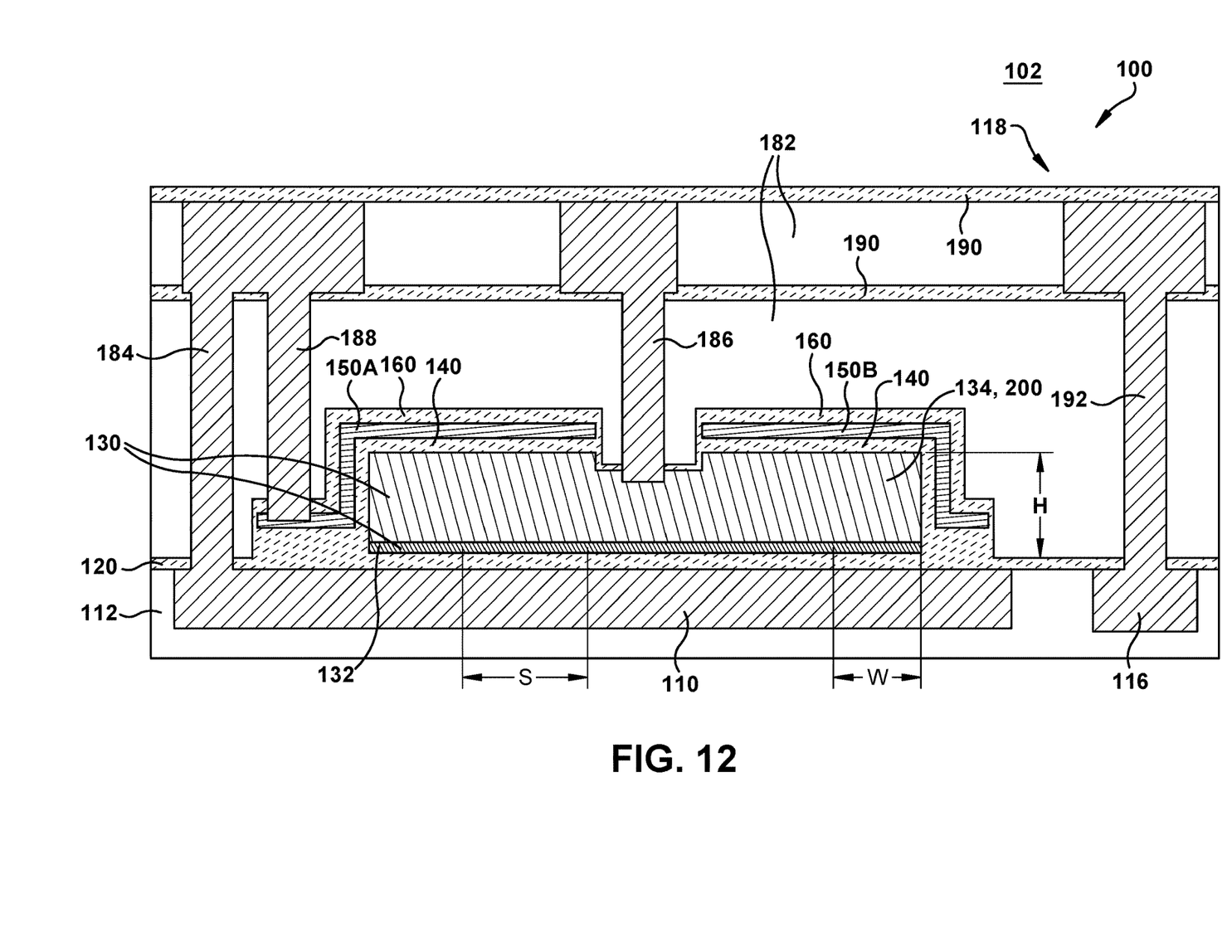
FIG. 12 shows a cross-sectional view along view line A-A in FIG. 11 of a capacitor structure, according to an alternative embodiment of the disclosure.

FIG. 11-12 show another alternative embodiment. FIG. 11 shows a plan view of capacitor structure 100, and FIG. 12 shows a cross-sectional view along view line A-A in FIG. 11. For reference, the cross-sectional view line B-B is that for FIGS. 7-10, and in particular that of FIG. 9. FIGS. 11 and 12 show an embodiment in which conductive pillars 134 are coupled together via a conductive connector 200. Conductive connector 200 is of the same material and may be formed at the same time as conductive pillars 134. Conductive connector 200 may be elongated compared to conductive pillars 134 in FIGS. 7-10.

Embodiments of the disclosure provide capacitor structure 100 that includes three electrodes and, in part, undulates over conductive pillars 134, creating a higher density capacitance compared to conventional stacked planar MIM capacitors, e.g., 3 femtofarads (fF) compared to 1.9 fF for planar MIM capacitors. Upper electrode 150 extends over the conductive pillars, which reduces contact resistance. As is apparent from the description, capacitor structure 100 can be integrated into IC 102 with no major integration issues. Capacitor structure 100 is also compatible with decreasing dimensions of the latest technology nodes, e.g., 7 nanometers and beyond.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A capacitor structure for an integrated circuit (IC), the capacitor structure comprising:
   a planar bottom electrode;
   a first insulator layer over the planar bottom electrode;
   a middle electrode including a discontinuous conductive layer over the first insulator layer and a plurality of spaced conductive pillars in contact with the discontinuous conductive layer, wherein each spaced conductive pillar is in contact with a respective discontinuous portion of the discontinuous conductive layer, and wherein the planar bottom electrode extends under an entirety of the middle electrode;
   a conductive connector electrically coupled to the plurality of spaced conductive pillars;
   a second insulator layer over and between the plurality of spaced conductive pillars and in contact with the discontinuous conductive layer; and
   an upper electrode layer over and between the plurality of spaced conductive pillars, wherein the upper electrode layer is discontinuous.

2. The capacitor structure of claim 1, wherein the planar bottom electrode includes a first capacitor metal, the upper electrode layer and the discontinuous conductive layer includes a different, second capacitor metal, and the plurality of spaced conductive pillars includes a different, third capacitor metal.

3. The capacitor structure of claim 2, wherein the first capacitor metal includes copper, the second capacitor metal includes a metal selected from a group comprising: titanium nitride (TiN), ruthenium (Ru), and tantalum nitride (TaN), and the third capacitor metal includes aluminum, and wherein the first insulator layer and the second insulator layer each include a dielectric selected from a group comprising: silicon nitride (SiN), tantalum oxide ($Ta_2O_5$), barium titanium oxide ($BaTiO_3$), hafnium oxide ($HfO_2$), zirconium oxide ($ZrO_2$), aluminum oxide ($Al_2O_3$), hafnium silicate oxide ($HfSixOy$) or hafnium silicon oxynitride ($HfSixOyNz$), where x, y, and z represent relative proportions, each greater than or equal to zero.

4. The capacitor structure of claim 1, further comprising a first contact operatively coupled to the planar bottom electrode, a second contact operatively coupled to the middle electrode, and a third contact operatively coupled to the upper electrode layer.

5. The capacitor structure of claim 4, wherein the second contact is operatively coupled to one of the plurality of spaced conductive pillars of the middle electrode layer.

6. The capacitor structure of claim 1, wherein the second insulator layer and the upper electrode layer undulate over the plurality of spaced conductive pillars.

7. The capacitor structure of claim 1, wherein at least one of the plurality of spaced conductive pillars is contacted on three sides by the second insulator layer.

8. The capacitor structure of claim 1, wherein the plurality of spaced conductive pillars includes at least two conductive pillars, and wherein the at least two conductive pillars each have a rectangular cross section.

9. A capacitor structure for an integrated circuit (IC), the capacitor structure comprising:
  a continuous planar bottom electrode including copper;
  a first insulator layer over the planar bottom electrode;
  a middle electrode including a conductive layer over the first insulator layer and a plurality of spaced aluminum pillars in contact with the conductive layer,
  wherein the continuous planar bottom electrode extends laterally under an entirety of the middle electrode;
  a second insulator layer over and between the plurality of spaced aluminum pillars and in contact with the conductive layer; and
  an upper electrode layer over and between the plurality of spaced aluminum pillars, wherein the upper electrode layer is discontinuous,
  wherein the first insulator layer and the second insulator layer electrically isolate the continuous planar bottom electrode, the middle electrode, and the upper electrode from each other.

10. The capacitor structure of claim 9, wherein the conductive layer and the upper electrode layer include a metal selected from a group comprising: titanium nitride (TiN), ruthenium (Ru), and tantalum nitride (TaN), and wherein the first insulator layer and the second insulator layer each include a dielectric selected from a group comprising: silicon nitride (SiN), tantalum oxide ($Ta_2O_5$), barium titanium oxide ($BaTiO_3$), hafnium oxide ($HfO_2$), zirconium oxide ($ZrO_2$), aluminum oxide ($Al_2O_3$), hafnium silicate oxide (HfSixOy) or hafnium silicon oxynitride (HfSixOyNz), where x, y, and z represent relative proportions, each greater than or equal to zero.

11. The capacitor structure of claim 9, further comprising a first contact operatively coupled to the continuous planar bottom electrode, a second contact operatively coupled to the middle electrode, and a third contact operatively coupled to the upper electrode layer.

12. The capacitor structure of claim 11, wherein the second contact is operatively coupled to one of the plurality of spaced aluminum pillars of the middle electrode.

13. The capacitor structure of claim 9, wherein the second insulator layer and the upper electrode layer undulate over the plurality of spaced aluminum pillars.

14. The capacitor structure of claim 9, wherein at least one of the plurality of spaced aluminum pillars is contacted on three sides by the second insulator layer.

15. The capacitor structure of claim 9, wherein the plurality of spaced aluminum pillars includes at least two aluminum pillars, and wherein the at least two aluminum pillars each have a rectangular cross section.

16. A method of forming a three-electrode capacitor structure for an integrated circuit, the method comprising:
  forming a continuous planar bottom electrode in a dielectric layer;
  forming a first insulator layer over the planar bottom electrode;
  forming a middle electrode by forming a conductive layer over the first insulator layer and forming a plurality of spaced aluminum pillars in contact with the conductive layer, the conductive layer physically separating a bottom of each aluminum pillar in the plurality of spaced aluminum pillars from the first insulator layer;
  wherein the continuous planar bottom electrode extends laterally under an entirety of the middle electrode;
  forming a second insulator layer over and between the plurality of spaced aluminum pillars and over the conductive layer; and
  forming an upper electrode layer over the second insulator layer, the upper electrode layer extending over and between the plurality of spaced aluminum pillars, wherein the upper electrode layer is discontinuous;
  wherein the second insulator layer and the upper electrode layer undulate over the plurality of spaced aluminum pillars, and
  wherein the first insulator layer and the second insulator layer electrically isolate the continuous planar bottom electrode, the middle electrode, and the upper electrode from each other.

17. The method of claim 16, wherein forming the middle electrode includes:
  forming the conductive layer over the continuous planar bottom electrode;
  forming an aluminum layer over the conductive layer;
  patterning the aluminum layer to form the plurality of spaced aluminum pillars.

18. The method of claim 16, further comprising forming a third insulator layer over the upper layer electrode, the third insulator layer extending over and between the plurality of spaced aluminum pillars.

19. The method of claim 16, wherein the continuous planar bottom electrode includes copper, and the upper electrode layer and the conductive layer include a metal selected from a group comprising: titanium nitride (TiN), ruthenium (Ru), and tantalum nitride (TaN), and wherein the first insulator layer and the second insulator layer each include a dielectric material selected from a group comprising: silicon nitride (SiN), tantalum oxide ($Ta_2O_5$), barium titanium oxide ($BaTiO_3$), hafnium oxide ($HfO_2$), zirconium oxide ($ZrO_2$), aluminum oxide ($Al_2O_3$), hafnium silicate oxide (HfSixOy) or hafnium silicon oxynitride (HfSixOyNz), where x, y, and z represent relative proportions, each greater than or equal to zero.

20. The method of claim 16, further comprising:
  patterning the middle electrode, the second insulator layer and the upper electrode layer to selected dimensions;
  forming an interlayer dielectric (ILD); and
  forming, through the ILD, a first contact operatively coupled to the continuous planar bottom electrode, a second contact operatively coupled to one of the plurality of spaced aluminum pillars of the middle electrode, and a third contact operatively coupled to the upper electrode layer.

* * * * *